United States Patent

Haselhoff

[11] Patent Number: 6,038,466
[45] Date of Patent: Mar. 14, 2000

[54] METHOD OF AND DEVICE FOR IMAGING AN OBJECT BY MEANS OF MAGNETIC RESONANCE

[75] Inventor: Eltjo H. Haselhoff, Eindhoven, Netherlands

[73] Assignee: U.S. Philips Corporation, New York, N.Y.

[21] Appl. No.: 09/164,323

[22] Filed: Oct. 1, 1998

[30] Foreign Application Priority Data

Oct. 2, 1997 [EP] European Pat. Off. .............. 97203030

[51] Int. Cl.$^7$ ...................................................... A61B 5/055
[52] U.S. Cl. ........................................... 600/410; 324/309
[58] Field of Search ................................. 600/407, 410; 382/131; 324/309

[56] References Cited

U.S. PATENT DOCUMENTS

| | | | |
|---|---|---|---|
| 5,107,838 | 4/1992 | Yamaguchi | 128/653.2 |
| 5,360,006 | 11/1994 | Geiser et al. | 128/653.1 |
| 5,361,763 | 11/1994 | Kao et al. | 128/653.2 |
| 5,427,100 | 6/1995 | Higashi et al. | 128/653.2 |
| 5,669,382 | 9/1997 | Curwen et al. | 128/653.1 |

Primary Examiner—Marvin M. Lateef
Assistant Examiner—Eleni Mantis Mercader
Attorney, Agent, or Firm—Dwight H. Renfrew

[57] ABSTRACT

The invention relates to a magnetic resonance (MR) imaging method for forming images of a part of a human or animal body which is arranged in a steady magnetic field, an MR image being made of the part which is directed transversely to a major axis of an ellipsoid which approximates the part. The method is used, for example for functional examination of a heart of a human body during which MR images are made of the left ventricle of the heart. Because the heart in every body may be oriented differently relative to a feet-to-head axis and relative to an axis transversely to the feet-to-head axis, the major axis of the ellipsoid should be determined so as to enable an MR image to be formed of an imaging plane which extends transversely of the major axis and contains a minor axis of the ellipsoid. To this end, two MR images are made of a first imaging plane and a second imaging plane of the heart, respectively, the first imaging plane and the second imaging plane being chosen in such a manner that they extend transversely to the feet-to-head axis of the body. Subsequently, a first reference and a second reference are determined in the first and the second MR image, respectively, said references being characterized by one and the same property in the MR images. The estimate of the major axis of the ellipsoid is then determined by a connecting line through two points which correspond to the first reference and the second reference, respectively.

15 Claims, 3 Drawing Sheets

METHOD OF AND DEVICE FOR IMAGING AN OBJECT BY MEANS OF MAGNETIC RESONANCE

BACKGROUND OF THE INVENTION

1. Field of the Invention

The invention relates to a magnetic resonance (MR) imaging method for imaging a part of a human or animal body arranged in a steady magnetic field, which method involves the use of imaging pulse sequences for the measurement of the MR signals for reconstructing the MR images, approximation of the part of the body by an ellipsoid, imaging of an imaging plane of the part which contains a minor axis of the ellipsoid, which minor axis is derived from a major axis of the ellipsoid, and which method includes the following steps for estimating the major axis:

a) formation of a first MR image of a first imaging plane and a second MR image of a second imaging plane of the part of the body, the first and the second imaging plane being chosen so as to extend transversely to a common axis of the body, b) determination of a first reference from the first MR image and a second reference from the second MR image, and c) determination of a first estimate of the major axis of the ellipsoid from a connecting line through two points which correspond to the first reference and the second reference, respectively.

The invention also relates to an MR device for carrying out such a method. An imaging plane is to be understood to mean herein a slice in the body of which an MR image is made.

2. Description of Related Art

A method of this kind is known from U.S. Pat. No. 5,107,838. The known method is used to form MR images for functional analysis of a part of the body, for example the heart of a human or animal body. It is thus used, for example to form perfusion MR images of the heart or MR images of the coronary artery system around the heart. According to the known method, the ellipsoid is used as a model description of, for example the left ventricle of the heart. Furthermore, for the formation of perfusion MR images or MR images of a coronary artery of the heart it is important that an imaging plane of the heart is reproduced which contains the minor axis of the ellipsoid. Because in every body the heart may be oriented differently with respect to a common axis of the body, for example a head to feet axis, the major axis and the minor axis to the ellipsoid must be determined relative to an axis transversely of the head-feet axis so as to form the MR image of the imaging plane containing the minor axis of the ellipsoid. The known method utilizes the two MR images so as to determine an orientation of the major axis, for which an operator determines, by way of a visual estimate, the first reference from the first MR image and the second reference from the second MR image. For the first reference, for example, a point in the first MR image is selected which corresponds to a point at an edge of a valve of the heart. For the second reference, for example, a point in the second MR image is chosen which corresponds to a point near a tip of the left ventricle. The major axis is subsequently determined by the connecting line between said points. The minor axis is subsequently determined from the major axis by way of an empirically determined ratio of the major axis to the minor axis of a human heart. It is a drawback of the known method that the estimate of the major axis is inaccurate and yields an MR image of an imaging plane of the body which deviates from an imaging plane of the body which contains the actual minor axis.

SUMMARY OF THE INVENTION

It is an object of the method according to the invention to reduce the deviation between the imaging plane reproduced by the MR image and an imaging plane containing the actual position of the minor axis. To achieve this, the method according to the invention is characterized in that the first reference and the second reference are determined by one and the same property. The invention is based on the recognition of the fact that the use of the same property for determining the first and the second reference enables the operator to make a better visual estimate; the use of geometric properties of the ellipsoid and the first and second reference offers a more accurate estimate of the major axis of the ellipsoid, yielding in a more accurate estimate of the minor axis so that the deviation between the imaging plane reproduced by the MR image and the imaging plane containing the actual position of the minor axis is reduced. Such a property for determining the first and second references is, for example, a center of a circular region in the MR image. Such a circular region may represent, for example, a cross-section of the left ventricle of the heart.

A further advantage of the use of the same property in the first and the second MR image consists in that the method can be simply implemented in an algorithm for determining said property, thus enabling automatic recognition of the property in the MR images so that a visual estimate by the operator might be dispensed with and a reproducible estimate of the major axis and the minor axis is obtained.

A special version of the method according to the invention is characterized in that it also includes steps for formation of a third MR image of a third imaging plane and a fourth MR image of a fourth imaging plane of the part of the body, the third and the fourth imaging plane being chosen so as to extend transversely to the first estimate made for the major axis, and a step in which a second estimate is made for the major axis by repeating the steps b) and c) while replacing the first MR image by the third MR image and the second MR image by the fourth MR image. This step yields a second estimate of the major axis of the ellipsoid which is a more accurate approximation than the first estimate of the major axis, thus reducing the deviation between the imaging plane reproduced by the MR image and the imaging plane containing the actual position of the minor axis.

A further version of the method according to the invention is characterized in that said property is determined by a center in a circular region of said MR images of the imaging planes of the part of the body. It has been found that circular regions in the MR images represent cross-sections of, for example the left ventricle of the heart and that the estimate of the major axis containing the centers of the circular region of a first and a second imaging plane of the heart constitutes a suitable approximation of a major axis of the ellipsoid. It is a further advantage that algorithms for determining centers of circles are reasonably firm, which means that said algorithms yield substantially the same results.

A further version of the method according to the invention is characterized in that in order to make a next estimate of the major axis which replaces a previous estimate of the major axis, the method also includes the following steps:

determination of an orientation line through a first point which corresponds to the first reference, substantially perpendicularly to the imaging planes, and determination of the next estimate of the major axis from a combination of a predetermined ratio of the minor axis to the major axis of the ellipsoid and an angle between the previous estimate of the major axis and the orientation line. The use of anatomic properties of the heart, for example the approximation of the left ventricle of the heart by means of an ellipsoid of revolution having the predetermined geometric ratio of the minor axis and the major axis, offers a more accurate estimate of the major axis.

A further version of the method according to the invention is characterized in that the imaging pulse sequences include an Echo Planar Imaging pulse sequence. The Echo Planar Imaging pulse sequence is known from EP-A-604441 and includes a fast MR imaging pulse sequence for reconstructing an MR image of an imaging plane of the part of the body.

A further version of the method according to the invention is characterized in that in order to enhance the contrast between the parts representing blood and the parts representing tissue in said MR images, the method includes a step in which a pre-pulse sequence is generated prior to the generating of the MR imaging pulse sequence. Such a pre-pulse sequence enhances the contrast between, for example parts in the MR image which represent blood present in myocardium and parts in the MR image which contain the myocardium. A $T_1Y$ pre-pulse sequence is an example of such a pre-pulse sequence. The $T_1Y$ pre-pulse sequence is known from the article "Myocardial Suppression In Vivo by Spin Locking with Composite Pulses", published by W. T. Dixon et al. in Magnetic Resonance in Medicine, No. 36, pp. 90–94, 1996. An advantage of the enhanced contrast in the MR image resides in the fact that it enables more accurate estimation of the references from the MR images.

A further version of the method according to the invention is characterized in that it includes a step in which a contrast medium is introduced into a blood stream through the part to be imaged. An example of such a contrast medium contains gadolinium-diethylenetetramine pentaaceticacetate (Gd-DPTA). This known paramagnetic contrast medium reduces the longitudinal magnetization relaxation time $T_1$ as well as the transverse magnetization relaxation time $T_2$, depending on the concentration used.

The invention also relates to a device for performing such a method. A device according to the invention for magnetic resonance imaging of a part of a body of a human or animal which is to be arranged in the device includes means for sustaining the static magnetic field, means for generating gradients, means for radiating RF pulses towards a body placed in the static magnetic field, control means for steering the generation of the gradients and the RF pulses, means for receiving and sampling MR signals generated by sequences of RF pulses and switched magnetic gradient pulses, means for reconstructing a first MR image and second MR image plane, respectively of a part of the body to be arranged in the device, which image planes are transverse to a common axis of the body arranged in the device, means for determining a first reference from the first MR image of the first image plane, means for determining a second reference from the second MR image of the second image plane, means for determining a first estimate of a major axis of an ellipsoid which approximates the part of the body to be arranged in the device, said first estimate being determined by a connecting line between two points, said two poings corresponding to the first and second reference, respectively, and means for forming an MR image of an imaging plane of the part which contains a minor axis of the ellipsoid. The device is characterized, in accordance with the invention, in that the means for determining the first reference and the means for determining the second reference are arranged to determine one and the same property from the first and the second MR image, respectively.

BRIEF DESCRIPTION OF THE DRAWING

The above and other, more detailed aspects of the invention will be described in detail hereinafter, by way of example, with reference to the drawing. Therein.

DETAILED DESCRIPTION OF THE PREFERRED EMBODIMENT

Figure 1:
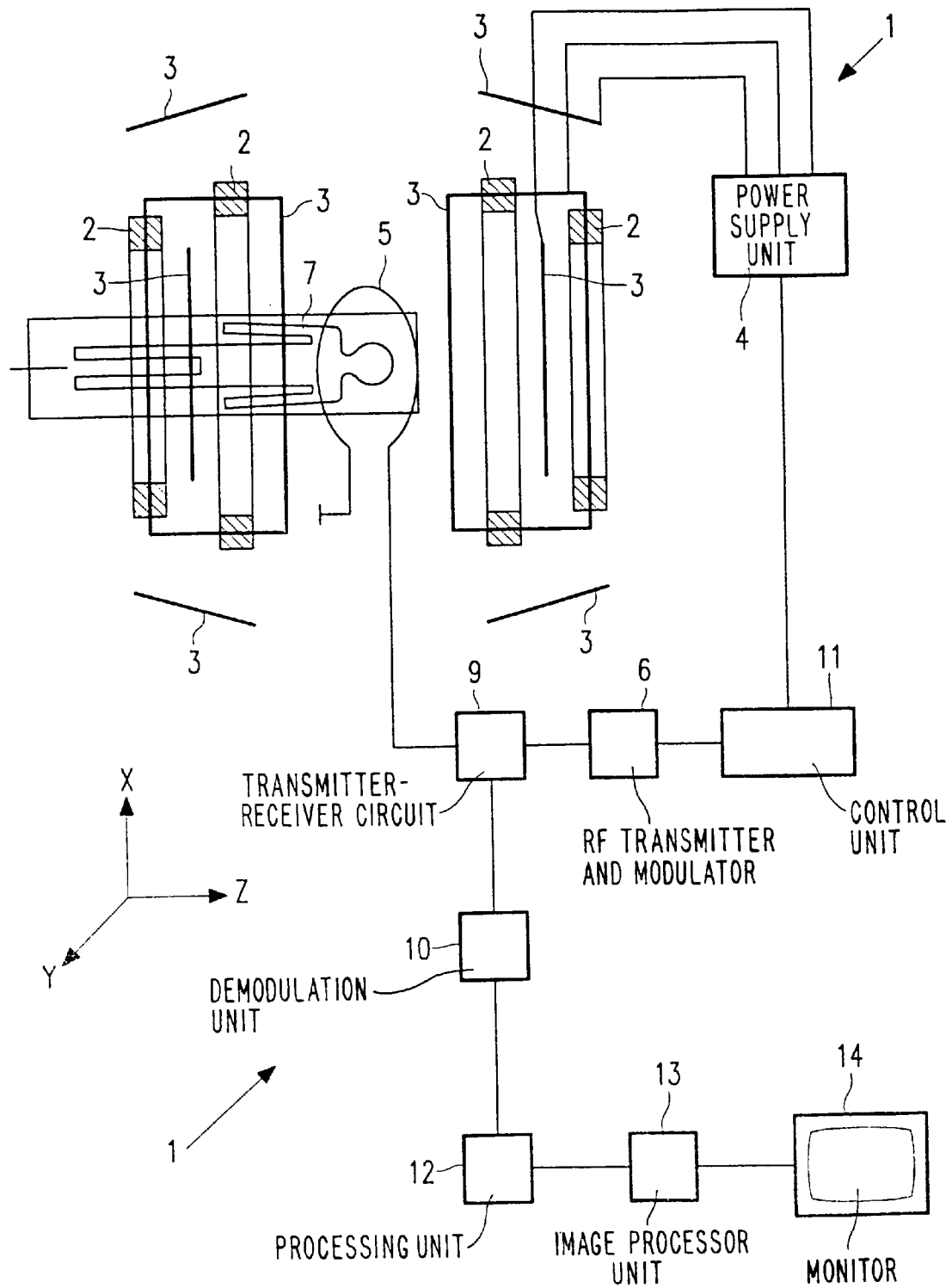
FIG. 1 shows a magnetic resonance imaging device.

FIG. 1 shows a magnetic resonance imaging device which includes a first magnet system 2 for generating a steady magnetic field, and also various gradient coils 3 for generating additional magnetic fields which are superposed on the steady magnetic field and cause a gradient in the steady magnetic field in three respective orthogonal directions of a co-ordinate system X, Y, Z. Generally speaking, a gradient in the first direction is referred to as a read-out gradient, a gradient in the second direction as a phase encoding gradient, and a gradient in the third direction as a selection gradient. The Z direction of the co-ordinate system shown corresponds by convention to the direction of the steady magnetic field in the magnet system 2. The measuring co-ordinate system X, Y, Z to be used may be chosen independently of the X, Y, Z co-ordinate system shown in FIG. 1. The gradient coils 3 are fed by the power supply unit 4. The MR device also includes an RF transmitter coil 5. The RF transmitter coil 5 serves to generate RF magnetic fields and is connected to an RF transmitter and modulator 6. A receiver coil is used to receive the magnetic resonance signal generated by the RF field in the object 7, or in a part of the object 7, to be examined in vivo, for example a human or animal body. This coil may be the same coil as the RF transmitter coil 5. The magnet system 2 encloses an examination space which is large enough to accommodate a part of the body 7 to be examined. The RF transmitter coil 5 is arranged around or on a part of the body 7 within the examination space. The RF transmitter coil 5 is connected, via a transmitter-receiver circuit 9, to a signal amplifier and demodulation unit 10. The control unit 11 controls the RF transmitter and modulator 6 and the power supply unit 4 so as to generate special MR imaging pulse sequences which contain RF pulses and gradients. The phase and amplitude provided by the demodulation unit 10 are applied to a processing unit 12. The processing unit 12 processes the applied signal values by way of, for example a two-dimensional Fourier transformation, so as to form an MR image. Via an image processing unit 13, the MR image is visualized on a monitor 14.

The invention will be described in detail hereinafter, by way of example, on the basis of a method which utilizes an MR imaging pulse sequence in the form of a known echo planar imaging (EPI) pulse sequence for forming MR images. An EPI pulse sequence is known from the cited EP-A-604441. Using these EPI pulse sequences, MR signals are measured and an MR image of a part of the body, for example an imaging plane containing a part of a left ventricle of a heart, is reconstructed from the measured MR signals, for example by means of two-dimensional Fourier transformation. However, besides said EPI imaging pulse sequences, other known MR imaging pulse sequences can also be used, for example a spin echo (SE) imaging pulse sequence, a rapid acquisition and relaxation enhancement (RARE) imaging pulse sequence, and a gradient and spin echo (GRASE) imaging pulse sequence. These imaging pulse sequences are also known from the cited EP-A-604441.

Figure 2:
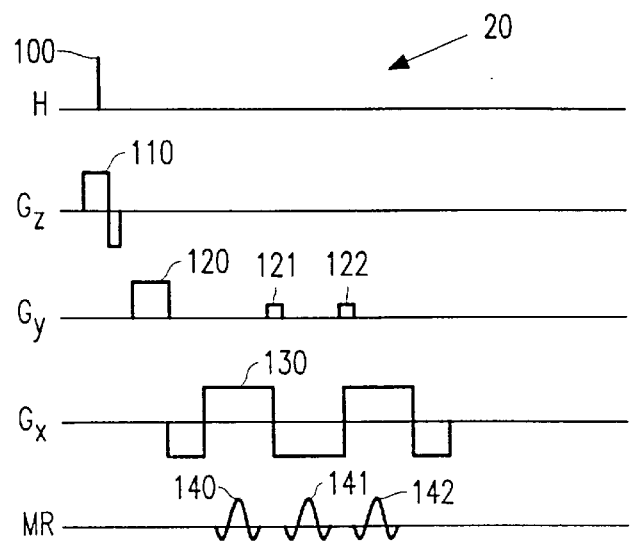
FIG. 2 shows an EPI pulse sequence.

FIG. 2 shows an EPI pulse sequence 20 which includes an excitation RF pulse and gradients. The EPI pulse sequence commences with the application of an excitation RF pulse 100, having a flip angle, and a selection gradient 110 for exciting the spins within a measuring zone, for example an imaging plane in the x, y plane through the body 7. The flip angle amounts to, for example 90°. The selection gradient is oriented in the z direction. After the slice selection, an initial phase encoding gradient 120 and a read-out gradient 130 are applied. Further phase encoding gradients 121, 122, referred to as "blips", are applied after the second and further zero crossings of the read-out gradient, so that MR signals 140, 141, 142 can be measured whose sampling instants are situated on lines which are uniformly distributed in the k-space. The EPI pulse sequence 30 is repeated for different values of the initial phase encoding gradients $G_y$ in order to measure a complete set of MR signals which relate, for example 128 or 256 lines in the k-space. In the context of the present patent application, a k-space is to be understood to mean a spatial frequency domain in which a path is traveled during the measurement of the MR signals by application of gradients to the steady magnetic field. The path in the k-space is determined by the time integral of the gradients applied during the interval between the excitation of the spins until the instant in time at which the MR signal is measured. The measured values of the MR signals corresponding to the most important part of the path or paths yield the inverse Fourier transformed values of an image of the imaging plane.

In order to determine an MR image of an imaging plane which extends transversely to a major axis of an ellipsoid approximating the left ventricle of the heart and which contains a minor axis of said ellipsoid, the major axis and the minor axis of the ellipsoid must be estimated. To this end, according to a first version of the method of the invention a first MR image of a first imaging plane of the heart and a second MR image of a second imaging plane of the heart are formed during a first step, the first and the second imaging plane being chosen in such a manner that they extend in parallel and substantially perpendicularly to a common axis, for example the head to feet axis, of the body in the heart, the position of the heart relative to the head to feet axis being estimated in a manner customarily used by those skilled in the art. In order to form a first estimate of the major axis of the ellipsoid approximating the left ventricle, subsequently a first reference is determined from the first MR image and a second reference is determined from the second MR image, the first and the second reference corresponding to the same property in the respective imaging planes of the heart. An example of such a property is a center of a circular region in the MR image which represents a transition between the myocardium and the blood present in the left ventricle. The major axis of the ellipsoid is subsequently estimated on the basis of a connecting line through two points in the steady field which correspond to the first reference and the second reference, respectively. The use of said property for determining the first estimate of the major axis will be described in detail with reference to FIG. 3.

Figure 3:
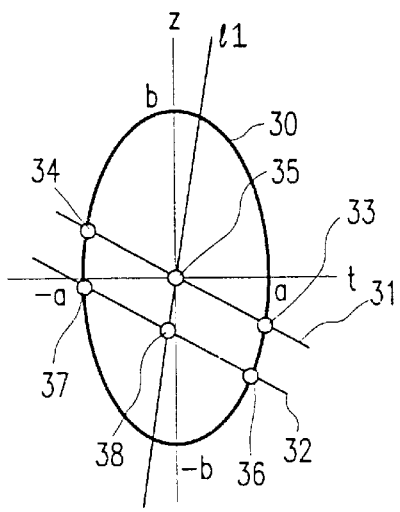
FIG. 3 shows a first cross-section of the imaging planes and the ellipsoid.

FIG. 3 shows a first cross-section of the imaging planes and the ellipsoid which contains an ellipse 30 and two parallel lines 31 and 32. The ellipse 30 represents a cross-section of the left ventricle of the heart in the direction of the major axis. The z axis represents the major axis of the left ventricle and the t axis represents a minor or transverse axis of the left ventricle. The ellipse 30 is described by the equation $$\frac{t^2}{a_2} + \frac{z^2}{b^2} = 1,$$

where t is a parameter along an axis in the direction of the minor axis, z represents a parameter along an axis in the direction of the major axis of the ellipse, and a and b are two constants which represent the length of the major axis and the minor axis, respectively. The parallel lines 31, 32 represent the imaging planes of the left ventricle which contain the minor axis of the first and the second MR image, respectively. The parallel lines 31, 32 are described by the equation $z = \alpha_a t + \beta_i$, where $\alpha_a$ is the direction coefficient and $\beta_i$ is a constant. The points of intersection of a first parallel line 31 and the ellipse 30 are subsequently determined as $$t_1 = \frac{-\alpha_a\left(\alpha_a\beta_i\alpha \pm \sqrt{-\beta_i^2 + b^2 + \alpha_a a^2 b}\right)}{b^2 + \alpha_a^2 a^2} \quad (1)$$

$$z_1 = \frac{-a\alpha_a\left(\alpha_a\beta_i\alpha \pm \sqrt{-\beta_i^2 + b^2 + \alpha_a a^2 b}\right)}{b^2 + \alpha_a^2 a^2} \quad (2)$$

A first center 35, having the co-ordinates $t_{M,i}$, $Z_{M,i}$ and situated between a first and a second point of intersection 33, 34 of the first parallel line 31 and the ellipse 30 is determined as $$t_{M,i} = \frac{\alpha_a \beta_i a^2}{b^2 + \alpha_a^2 a^2} \quad (3)$$

$$z_{M,i} = \frac{\beta_i b^2}{b^2 + \alpha_a^2 a^2} \quad (4)$$

Analogously, a second center 38 is determined between a third and a fourth point of intersection 36, 37 of the second parallel line 32 and the ellipse 30. A first connecting line L1, constituting the first estimate of the major axis, is given by the equation:

$$z = \frac{-b^2}{a^2 \alpha_a} t \quad (5)$$

Using the estimate made for the major axis, a third MR image can be formed which reproduces a third imaging plane of the left bentricle and is oriented transversely of the first estimate L1 of the major axis.

The inaccuracy which occurs in the estimate of the major axis while using the first version of the method according to the invention can be classified in two classes. A first class is governed by the determination of the first connecting line L1 and a second class is governed by the approximation of the left ventricle by means of the ellipsoid. The inaccuracy of the determination of the first connecting line L1 follows from the formula (5) used and will not be elaborated upon. The inaccuracy of the second class, occ urring during the estimation of the major axis by the connecting line, can be determined by performing a first numerical error analysis. According to the first numerical error analysis, the difference is determined between the formula (5) for an assumed fixed value of the ratio n=b/a of 0.25 and a current value of the formula (5) for a practical value of the ratio n=b/a which may vary from 0.1 to 0.4 and an angulation $\alpha_a$ which may vary from 0° to 90°. The result of the first numerical error analysis will be described with reference to FIG. 4.

Figure 4:
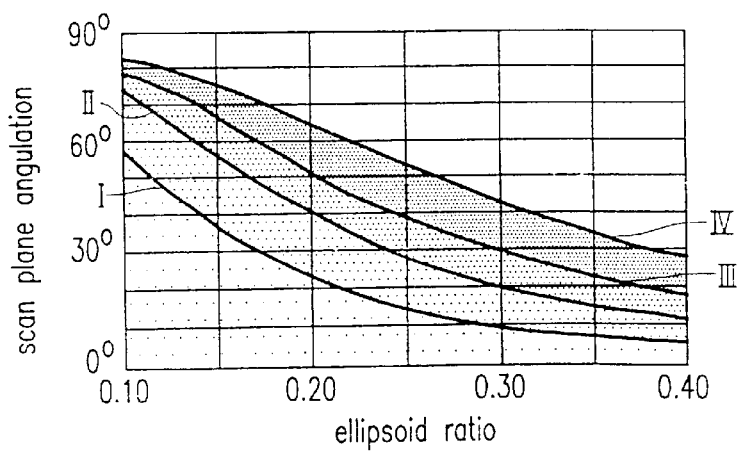
FIG. 4 shows a first contour diagram of the second class inaccuracy as a function of the ellipsoid ratio and the angulation.

FIG. 4 shows a first contour diagram of the inaccuracy as a function of the ellipsoid ratio and the angulation. In the present application the ellipsoid ratio is to be under-stood to mean the ratio n of the minor axis to the major axis of the ellipsoid and angulation is to be understood to mean the angle of the imaging plane of an MR image relative to the direction of the magnetic field. The surface area below a first line I in FIG. 4 represents a first region in which the inaccuracy of the second class remains less than 1 degree in the determination of the major axis; the surface area between the first line I and a second line II represents a second region in which said inaccuracy remains less than 2 degrees; the surface area between the second line II and a third line III represents a third region in which said inaccuracy remains less than 3 degrees; the surface area between the second line III and a fourth line IV represents a fourth region in which said inaccuracy remains less than 5 degrees and, finally, the surface area above the line IV represents a fifth region in which said inaccuracy amounts to more than 5 degrees. It has been found in practice that said second-class inaccuracy is limited to less than 1 degree for an ellipsoid representing a ventricle of a heart whose ellipsoid ratio is less than 0.1 with an angulation of the first imaging plane amounting to approximately 30 degrees. Said second-class inaccuracy is less than 5 degrees for an ellipsoid ratio of 0.25 and an angulation of the first imaging plane amounting to approximately 50 degrees.

In order to make a more accurate second estimate of the major axis, subsequently a third and a fourth MR image are made of a third and a fourth imaging plane of the heart, respectively, the third and the fourth imaging plane being selected in such a manner that they extend parallel to one another and transversely of the first estimate of the major axis. Subsequently, a third and a fourth reference are determined from the third and the fourth MR image, respectively, said references corresponding to a third and a fourth center, respectively, of circular regions in the third and the fourth MR image, respectively, which represent the transitions between the myocardium and the blood. A second estimate of the major axis is then determined by a second connecting line L2 through two points in the steady magnetic field which correspond to the third and the fourth reference, respectively, in the same way as described with reference to FIG. 3.

Using, for example the first version of the method according to the invention, in practice a first estimate of the major axis can be made on the basis of an angulation of the first and the second MR imaging plane which amounts to 50 degrees and an ellipsoid ratio of 0.1, an inaccuracy of the second class amounting to approximately 5 degrees for the first estimate of the major axis. Subsequently, an inaccuracy of the second estimate of the major axis of approximately 1 degree can be achieved by way of a second estimate of the major axis which is determined by repeating the steps of the first version for the third and the fourth MR image. This method can be used in practice for the estimation of the major axis of an ellipsoid which represents the left ventricle of the heart with an ellipsoid ratio which may vary in a range from 0.1 to 0.4 and an angulation of the imaging planes which may vary in a range from 0 to 70 degrees.

For further enhancement of the accuracy of an estimate of the major axis of the ellipsoid, use is made of the three-dimensional geometrical properties of an ellipsoid of revolution so as to determine also the orientation of the minor axis relative to the steady magnetic field. This version of the method will be described in detail with reference to FIG. 5.

Figure 5:
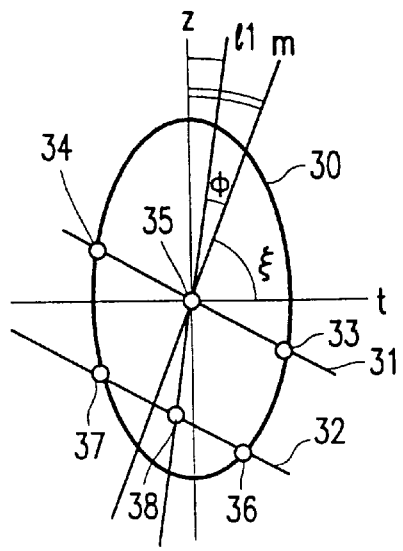
FIG. 5 shows a second cross-section of the imaging planes and the ellipsoid.

FIG. 5 shows a second cross-section of the imaging planes and the ellipsoid, which second cross-section contains the ellipse 30 and the parallel lines 31 and 32. FIG. 5 also shows the connecting line L1 and an orientation line M. The first connecting line L1 between the first center 35 and a second center 38 of the first and the second point of intersection 33, 34, respectively, of the first parallel line 31 with the ellipse 30 and the third and the fourth point of intersection 36, 37, respectively, of the second parallel 32 is determined by means of the formulas (1), (2), (3), (4) and (5). The orientation line M is directed substantially perpendicularly to the parallel lines 31, 32. The angle between the orientation line M and the minor axis of the ellipsoid t is then given by the equation:

$$\xi = \tan^{-1}\left[\frac{2}{\cot\phi(n^2 - a) \pm \sqrt{\cot^2\phi \cdot (n^2 - 1)^2 - 4n^2}}\right] \quad (6)$$

in which $\xi$ represents the angle between the direction of the orientation line M and the minor axis of the ellipsoid t, and $\phi$ represents the angle between the first connecting line L1 and the orientation line M. The direction of the orientation line M is known because it has been chosen to extend perpendicularly to the first and the second imaging plane of the left ventricle and the directions of the first and the second imaging plane relative to the direction of the steady magnetic field are known. The direction of the first connecting line L1 is known from the first estimate of the major axis of the ellipsoid. An improved estimate of the major axis is offered by rotation of the orientation line M in the direction of the first connecting line L1 through an angle amounting to $\pi/2-\xi$. The validity of the formula (6) is limited to a positive value of a discriminant wherefrom a square root is determined. In the present example this means that the maximum angle $\phi_c$ between the first connecting line L1 and the orientation line M, corresponding to the maximum angle between planes of the imaging planes of the heart to be imaged and a major axis of the ellipsoid which represents the left ventricle of the heart of a body in the examination space, is determined by the formula $$\phi_c = \tan^{-1}\left(\frac{(1-n^2)}{2n}\right) \quad (7)$$

For an ellipsoid ratio n for a human body, customarily having a value of, for example 0.25, formula (7) then yields a value of 60 degrees for the limit angle for the angulation $\phi_c$.

Figure 6:
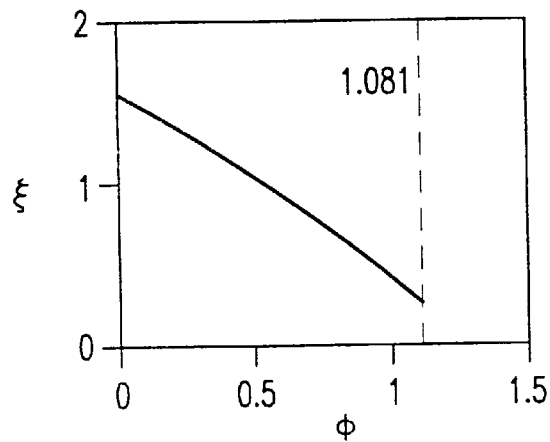
FIG. 6 shows an error diagram of a first-class inaccuracy.

An inaccuracy of the first class in the second estimate of the major axis while using the second version of the method of the invention is then determined by the formula (6) and the absolute inaccuracy in S and will be explained with reference to FIG. 6. FIG. 6 shows the effect of an inaccuracy of the first class in a line 60 which represents the function $\xi(\phi)$ for the range $0' \leq \phi \leq \phi_c$, where $\phi_c = 1.081$. The angle $\phi$ is plotted in radians along the horizontal axis and the angle $\xi$ is plotted in radians along the vertical axis. FIG. 6 shows that an inaccuracy in the determination of the angle $\phi$ yields a substantially equal inaccuracy in the determination of the angle $\xi$. The inaccuracy of the second class, occurring during the estimation of the major axis by the connecting line while using the second version, can be determined by performing a second numerical error analysis. According to the second numerical error analysis the difference is determined between the formula (6) for an assumed fixed value of the ellipsoid ratio $$n = \frac{b}{a}$$

amounting to 0.25 and a current value of the formula (6) for a practical value of the ellipsoid ration $$n = \frac{b}{a}$$

which may vary from 0.1 to 0.4 and an angulation $\alpha_a$ which may vary from 0 to 90 degrees. The result of the second numerical error analysis will be described with reference to FIG. 7.

Figure 7:
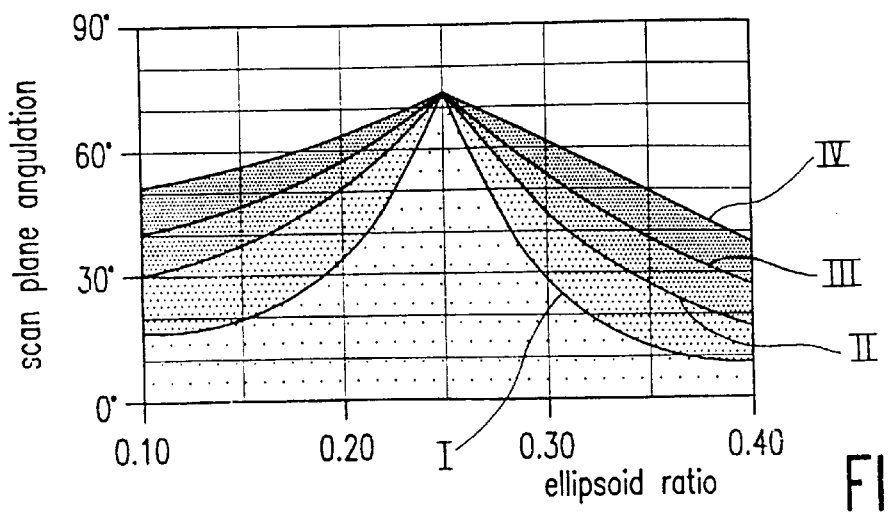
FIG. 7 shows a second contour diagram of the second-class inaccuracy as a function of the ellipsoid ratio and the angulation.

FIG. 7 shows a second contour diagram of the inaccuracy as a function of the ellipsoid ratio n and the angulation. The second contour diagram shows the lines I, II, II, IV which define the first, the second, the third, the fourth and the fifth region. The value of the inaccuracy in said regions is the same as described with reference to FIG. 5.

It is also possible to determine the first estimate of the major axis by means of the first version of the method and to determine subsequently the third and the fourth MR image, followed by the determination of a more accurate second estimate of the major axis by means of the second version of the method.

A known edge detection algorithm can be used to determine a center of a circular region in an MR image of an imaging plane of the left ventricle. This algorithm is known from the article "Discrete Dynamic Contour Model", published by S. Lobregt and M. A. Viergever in IEEE Transactions on Medical Imaging, Vol. 14, No. 1 (1995), pp. 12–24. Subsequently, a center of the circular region is determined by way of a center detection algorithm, said center representing the transition between the myocardium and the blood in the left ventricle of the heart.

In order to enhance the accuracy of the edge detection algorithm, the contrast between the part of the MR image representing the myocardium and the part representing the blood in the left ventricle can be increased. To this end, for example use can be made of a $T_1Y$ pre-pulse sequence. The $T_1Y$ pre-pulse sequence is known from the cited article "Myocardial Suppression In Vivo by Spin Locking with Composite pulses", published by W. T. Dixon et al. The $T_1Y$ pre-pulse sequence is generated prior to the EPI pulse 20. Said contrast amounts to approximately 2 in an MR image formed in a customary manner by means of, for example EPI pulse sequences. When a $T_1Y$ pre-pulse sequence is applied prior to the EPI pulse sequences, said contrast in the MR image is increased to 4.

Another possibility for a pre-pulse sequence preceding the EPI imaging pulse sequence is the generating of a known $T_2$ pre-pulse sequence prior to the EPI pulse sequence 20. The $T_2$ pre-pulse sequence is known from the article "Coronary Angiography with Magnetization-Prepared $T_2$ Contrast", published by J. H. Brittain et al. in Magnetic Resonance in Medicine, No. 33, pp. 689–696, 1995. The $T_2$ pre-pulse sequence is generated prior to the generating of the excitation RF pulse 100 of the EPI pulse sequence 20 and suppresses muscular tissue and vascular tissue in an MR image of, for example the left ventricle of the heart.

Another possibility for enhancing the contrast is the introduction of a contrast medium into the blood stream, so that in an MR image of an imaging plane of the heart the blood contained in the myocardium is reproduced with a higher contrast than the myocardium. Gd-DPTA is an example of a known contrast medium. For such a contrast medium the measured $T_1$ and $T_2$ are influenced in conformity with $$T_1^{-1} = T_1^{-1} + R_1 \cdot C \qquad (8)$$

$$T_2^{-1} = T_2^{-1} + R_2 \cdot C \qquad (9)$$

where $R_1$, $R_2$ are respective constants and C is the concentration. For a magnetic field strength of, for example 1.5 T, the values of the two constants $R_1$, $R_2$ are approximately 4.5 $ms^{-1}$ $(mmol/kg)^{-1}$.

All references cited herein are incorporated herein by reference in their entirety and for all purposes to the same extent as if each individual publication or patent or patent application was specifically and individually indicated to be incorporated by reference in its entirety for all purposes.

I claim:

1. A magnetic resonance (MR) imaging method for imaging a part of a human or animal body arranged in a steady magnetic field comprising generating imaging pulse sequences for the measurement of the MR signals for reconstructing MR images, approximating the part of the body by an ellipsoid, imaging of an imaging plane of the part which contains a minor axis of the ellipsoid, which minor axis is derived from a major axis of the ellipsoid, and which method includes the following steps for estimating the major axis:

a) forming a first MR image of a first imaging plane and a second MR image of a second imaging plane of the part of the body, the imaging planes extending transversely of a common axis of the body, b) determining a first reference from the first MR image and a second reference from the second MR image, and c) determining a first estimate of the major axis of the ellipsoid from a connecting line through two points which correspond to the first reference and the second reference, respectively, wherein the first and the second reference are determined by one and the same property.

2. A method as claimed in claim 1 wherein the method also includes steps for forming a third MR image of a third imaging plane and a fourth MR image of a fourth imaging plane of the part of the body, the third and the fourth imaging plane being chosen so as to extend transversely of the first estimate made for the major axis, and making a second estimate for the major axis by repeating the steps b) and c) while replacing the first MR image by the third MR image and the second MR image by the fourth MR image.

3. The method of claim 2 wherein said property is determined by a center in a circular region in said MR images of the imaging planes of the part of the body.

4. The method of claim 2 wherein in order to make a next estimate of the major axis which replaces a previous estimate of the major axis the method also comprises the following steps determining an orientation line through a first point which corresponds to the first reference, substantially perpendicularly to the imaging planes, and determining the next estimate of the major axis from a combination of the predetermined ratio of the minor axis to the major axis of the ellipsoid and an angle between the previous estimate of the major axis and the orientation line.

5. The method of claim 4 wherein the predetermined ratio of the minor axis to the major axis of the ellipsoid is chosen to be approximately ¼.

6. The method of claim 2 wherein the imaging pulse sequences include an Echo Planar Imaging pulse sequence.

7. The method of claim 2 wherein in order to enhance the contrast between the parts representing blood and the parts representing tissue in said MR images, the method also comprises a step in which a pre-pulse sequence is generated prior to the generating of the MR imaging pulse sequence.

8. The method of claim 2 wherein in order to enhance the contrast in said MR images the method includes a step in which a contrast medium is introduced into a blood stream passing through the part to be imaged.

9. A method as claimed in claim 1 wherein said property is determined by a center in a circular region in said MR images of the imaging planes of the part of the body.

10. A method as claimed in claim 1 wherein in order to make a next estimate of the major axis which replaces a previous estimate of the major axis the method also comprises the following steps determining an orientation line through a first point which corresponds to the first reference, substantially perpendicularly to the imaging planes, and determining the next estimate of the major axis from a combination of the predetermined ratio of the minor axis to the major axis of the ellipsoid and an angle between the previous estimate of the major axis and the orientation line.

11. A method as claimed in claim 10 wherein the predetermined ratio of the minor axis to the major axis of the ellipsoid is chosen to be approximately ¼.

12. A method as claimed in claim 1 wherein the imaging pulse sequences include an Echo Planar Imaging pulse sequence.

13. A method as claimed in claim 1 wherein in order to enhance the contrast between the parts representing blood and the parts representing tissue in said MR images, the method also comprises a step in which a pre-pulse sequence is generated prior to the generating of the MR imaging pulse sequence.

14. A method as claimed in claim 1 wherein in order to enhance the contrast in said MR images the method includes a step in which a contrast medium is introduced into a blood stream passing through the part to be imaged.

15. A magnetic resonance (MR) device for imaging a part of a body of a human or animal which is to be arranged in the device comprising:

means for sustaining a steady magnetic field, means for generating RF pulses, means for generating gradients in the steady magnetic field, a control unit for generating control signals for the means for generating RF pulses and the means for generating the gradients, means for measuring MR signals, means for reconstructing a first MR image and a second MR image from the measured MR signals from a first imaging plane and a second imaging plane, respectively, of a part of the body, which imaging planes are directed transversely to a common axis of the body, means for determining a first reference from the first MR image of the first imaging plane, means for determining a second reference from the second MR image of the second imaging plane, means for determining a first estimate of a major axis of an ellipsoid which approximates the part of the body, said first estimate being determined by a connecting line between two points, said two points corresponding to the first reference and the second reference, respectively, and means for forming an MR image of an imaging plane of the part which contains a minor axis of the ellipsoid, wherein the means for determining the first reference and the means for determining the second reference are arranged to determine the same property.

* * * * *